United States Patent [19]
Goto et al.

[11] Patent Number: 4,632,060
[45] Date of Patent: Dec. 30, 1986

[54] BARREL TYPE OF EPITAXIAL VAPOR PHASE GROWING APPARATUS

[75] Inventors: Taizan Goto; Isao Sekiya, both of Numazu, Japan

[73] Assignee: Toshiba Machine Co. Ltd, Tokyo, Japan

[21] Appl. No.: 710,967

[22] Filed: Mar. 12, 1985

[30] Foreign Application Priority Data

Mar. 12, 1984 [JP] Japan ............................ 59-35721[U]

[51] Int. Cl.⁴ ............................................ C23C 13/08
[52] U.S. Cl. .................................. 118/730; 118/715; 118/733
[58] Field of Search ............... 118/724, 730, 733, 715; 219/343, 347, 405

[56] References Cited

U.S. PATENT DOCUMENTS 4,446,817 5/1984 Crawley .............................. 118/725

Primary Examiner—Richard Bueker
Attorney, Agent, or Firm—Cushman, Darby & Cushman

[57] ABSTRACT

A barrel-type epitaxial vapor phase growing apparatus in which a susceptor for mounting wafers to be treated on a plurality of plates is rotatably hung by a rod inside a bell jar. Purge gases are supplied to the casing housing the drive mechanism and a baffle directs the gases along the rod and into the susceptor. The purge gases carry dust which is thus kept away from the wafers on the outside of the susceptor as it passes through the susceptor to an exhaust at the lower end of the reaction chamber. The flowing purge gases also cool the susceptor more quickly after treatment.

3 Claims, 2 Drawing Figures

BARREL TYPE OF EPITAXIAL VAPOR PHASE GROWING APPARATUS

BACKGROUND OF THE INVENTION

The present invention relates to a semiconductor vapor phase growing apparatus, specifically to a barrel type epitaxial vapor phase growing apparatus.

FIG. 1 illustrates a longitudinal sectional view of a conventional barrel-type of epitaxial vapor phase growing apparatus. In the figure, a bell-jar 11 made of quartz defines a reaction chamber 12 closed at the top by a seal plate 20 made of stainless steel and a ring 19 of stainless steel with O-ring packings 18 and 18A between a flange 17 at the top of bell-jar 11 and plate 20. Seal plate 20 has an opening 20A at its center through which hanger rod 25 hangs a susceptor assembly S rotatably mounted by a roller bearing assembly 20B on seal plate 20. An airtight gear box 22 mounting a driving motor 23 thereon is also provided on plate 20. A gear 24 driven by a drive axis 23A of motor 23 meshes with a gear 26 fixedly connected on the top of hanger rod 25. A quartz baffle 21 hangs from seal plate 20 to cover and protect the inside surfaces of reaction chamber 12, seal plate 20 and ring 19 from corrosive gases such as Hydrogen Chloride (HCl) or Silicon Tetrachloride ($SiCl_4$) flowing into reaction chamber 12 from a nozzle 27 mounted on ring 19.

Susceptor assembly S includes a carbon top plate 13 fixed at the lower end of hanger rod 25, a carbon bottom plate 14. The circumferences of plates 13 and 14 are formed as a polygon, for example hexagonal or octagonal, and a plurality of carbon plate susceptors 15 extend therebetween. Each susceptor 15 is located between top plate 13 and bottom plate 14 with a slight slope outwardly with respect to the downward direction. On the surface of each susceptor 15 is provided a plurality of small recesses in which a semiconductor substrate 16 (hereinafter called a wafer) is mounted for treatment. Outside of bell-jar 11, a plurality of infrared ray lamps 30 surrounded by a cover 30A heat susceptors 15 and wafers 16. Outlet 31 exhausts gases from reaction chamber 12.

As mentioned above, ring 19 mounts nozzle 27 in an air tight connection, through which reaction gases such as Dichlorosilane ($SiH_2Cl_2$) or Silicon Tetrachloride ($SiCl_4$) flow into reaction chamber 12. Seal plate 20 mounts an inlet 28 in an air-tight connection, through which purge gases such as nitrogen gas ($N_2$) or hydrogen gas ($H_2$) flow into reaction chamber 12 through a gap 21A between seal plate 20 and baffle 21. Also, on the side plate of gear box 22, an inlet 29 for purge gases such as "$N_2$" or "$H_2$" is mounted in air tight connection, through which the purge gases flow into the inside of gear box 22. The purge gases inside of gear box 22 flow through bearing 20B into reaction chamber 12. The flow of purge gases from inlets 28 and 29 into reaction chamber 12 prevents reaction gases from invading gear box 22 and gap 21A between seal plate 20 and baffle 21, and prevents reaction gases corroding seal plate 20, bearing 20B and gears 24 and 28.

In the conventional type of epitaxial vapor phase growing apparatus mentioned above, the purge gases from inlet 29 flowing through gear box 22 and bearing 20B into reaction chamber 12 carry particles of dust from the driving mechanism including gears 24 and 26, bearing 20B, etc. Those particles of dust adhere to the surface of wafer 16 reducing the quality of the wafer. Furthermore, they produce "auto doping" and lowered resistance values in the wafer.

SUMMARY OF THE INVENTION

It is an object of the present invention to prevent particles of dust from the rotary driving mechanism flowing into the reaction chamber and thus prevent "auto-doping".

According to the present invention, the susceptor assembly has a plurality of side surfaces and is rotatably hung by a hanger rod connected with a rotary drive. Bottom and top plates with openings, and a baffle covering the circumferential surface of the hanger rod are provided as in the prior art. The lower end of the baffle is air-tight or semi-air tight mounted on the top plate to allow purge gases to flow from a gap between the hanger rod and the baffle into the inside of the susceptor assembly through the opening on the top plate, and to exhaust through the openings in the bottom plate to the outside of the bell jar. Thus the wafers on the outside of the susceptor are not exposed to the dust carrying purge gases. The cool purge gases also speed the cooling time of the susceptor after treatment.

BRIEF DESCRIPTION OF THE DRAWINGS

Further objections and advantages will be more fully understood from the following detailed description taken in conjunction with the accompanying drawings, in which.

DESCRIPTION OF THE PREFERRED EMBODIMENTS

Figure 1:
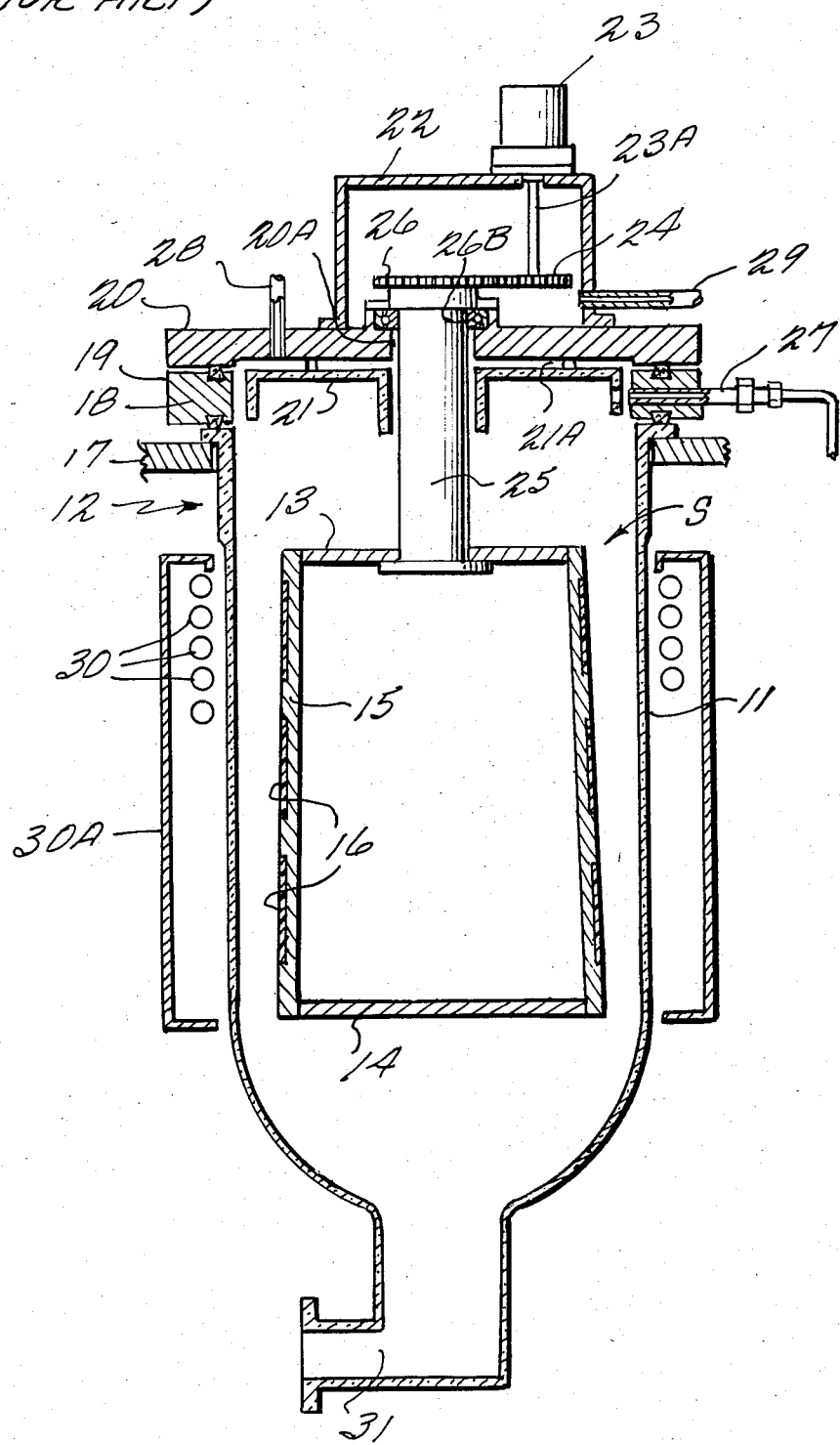
FIG. 1 is a longitudinal sectional view of a conventional barrel type of epitaxial vapor phase growing apparatus.
Figure 2:
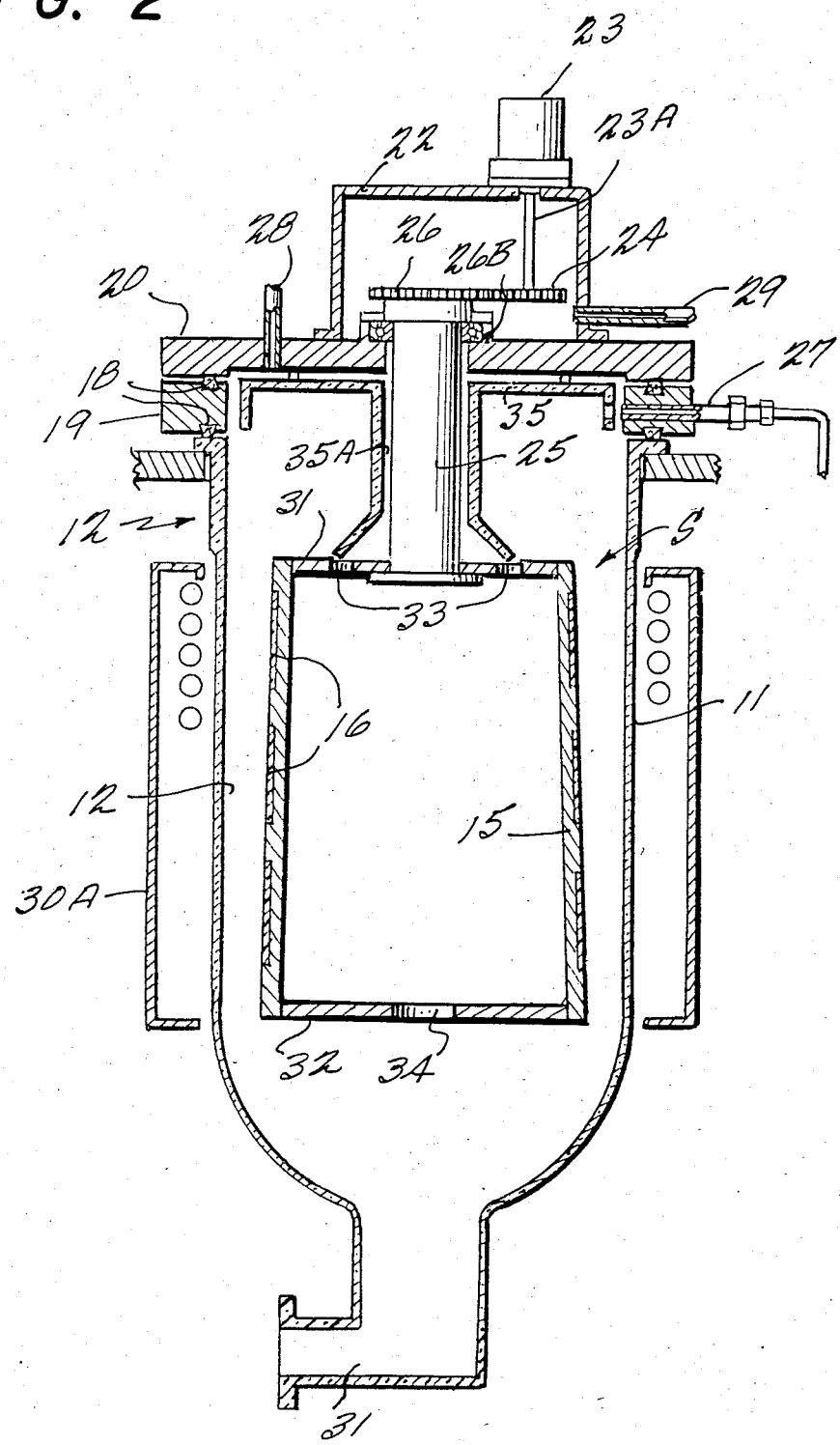
FIG. 2 is a longitudinal sectional view of a barrel-type of epitaxial vapor phase growing apparatus of the present invention.

Since each element of the apparatus of the present invention shown in FIG. 2 precisely corresponds to the conventional apparatus shown in FIG. 1 except a baffle, a top plate and a bottom plate, each numeral for the corresponding element shown in FIG. 2 is the same one as in FIG. 1. Furthermore, only different elements from those in FIG. 1 are hereinafter described. In FIG. 2, openings 33 and 34 are provided in top plate 31 and bottom plate 32, respectively. A quartz baffle 35 is hung from seal plate 20, and covers the circumferential surface of hanger rod 25. The lower end of baffle 35 is air-tight or semi air-tight mounted on the top plate 31. The lower end of baffle 35 contacts plate 31 outside opening 33 of the top plate 31.

According to the above explained configuration shown in FIG. 2, the purge gases from inlet 29 in the inside of gear box 22 include particles of dust from gears 24 and 26. The purge gases including particles of dust go through gap 35A between hanger rod 25 and baffle 35 to opening 33 of top plate 31 and flow inside of susceptor assembly S, eventually to be exhausted through opening 34 to an exhausting outlet 31. Therefore, wafers 16 on susceptor 15 are not contaminated by gases including particles of dust.

When epitaxial vapor phase growth on wafers 16 terminates, it is required to cool the temperature of susceptor 15 before susceptor 15 can be taken out of reaction chamber 12 by moving seal plate 20 upwardly. In the present invention, susceptor 15 can be cooled in a short time because cooling of both the inside and outside surfaces of susceptor 15 simultaneously occurs by transfer of heat to the low temperature purge gases.

As above described, the epitaxial vapor phase growing apparatus of the present invention has an advantage that high quality epitaxial growth can be produced since particles of dust from the driving mechanism in the gear box are admitted through the opening on the top plate of the susceptor assembly into the inside of the assembly without adhering to the wafers and contaminating the reaction gases, thereby preventing "auto doping".

What is claimed is:

1. A barrel-type epitaxial vapor phase growing apparatus comprising:
    a bell jar having a reaction chamber defined therein,
    a susceptor assembly mounted within said reaction chamber and having a plurality of plates for mounting wafers to be treated,
    a seal plate forming a top cover of the bell jar,
    rotary drive means mounted on said seal plate for rotating said susceptor assembly including a drive mechanism and a case for said mechanism,
    a hanger rod connected between said drive means and said susceptor and rotatably mounted on the seal plate from which said rod is hung downwards, the lower portion of the hanger rod being located in said reaction chamber,
    means for supplying purge gases to the inside of said case, and
    baffle means for directing said purge gases along the circumferential surface of said hanger rod into said susceptor assembly so that said purge gases pass therethrough to the lower portion of said reaction chamber.

2. The apparatus as in claim 1, wherein said susceptor assembly including a top plate with an opening, a bottom plate with an opening and a susceptor located between said top and bottom plates, and said baffle means includes a baffle hung from said seal plate, covering the circumferential surfaces of said hanger rod and the top surface of said top plate outside the opening in said top plate.

3. The apparatus as in claim 2, wherein said seal plate is provided with an inlet from which other purge gases are supplied, and an upper portion of said baffle forms a disk extending in a radial direction perpendicular to said hanger rod to direct said other purge gases radially inward.

* * * * *